United States Patent
Foo et al.

(10) Patent No.: US 6,425,864 B1
(45) Date of Patent: Jul. 30, 2002

(54) METHOD AND APPARATUS FOR OPTIMAL IMAGING OF THE PERIPHERAL VASCULATURE

(75) Inventors: Thomas K. F. Foo, Rockville; Vincent B. Ho, North Bethesda, both of MD (US); Rebecca A. McCann, Sussex, WI (US)

(73) Assignees: General Electric Company, Milwaukee, WI (US); The United States of America as represented by the Department of Health and Human Services, Washington, DC (US)

( * ) Notice: Subject to any disclaimer, the term of this patent is extended or adjusted under 35 U.S.C. 154(b) by 0 days.

(21) Appl. No.: 09/292,548

(22) Filed: Apr. 15, 1999

(51) Int. Cl.[7] .............................................. A61B 5/055

(52) U.S. Cl. ........................ 600/420; 600/415; 600/419; 324/306; 324/309

(58) Field of Search ................................. 600/420, 415, 600/410, 419; 324/306, 307, 309, 318, 322

(56) References Cited

U.S. PATENT DOCUMENTS

| | | | |
|---|---|---|---|
| 5,694,935 A | * 12/1997 | Damadian | 600/420 |
| 5,713,358 A | * 2/1998 | Mistretta et al. | 600/420 |
| 5,746,208 A | 5/1998 | Prince | 128/653.4 |
| 5,792,056 A | * 8/1998 | Prince | 600/420 |

(List continued on next page.)

FOREIGN PATENT DOCUMENTS

WO  WO 96/04567  2/1996

OTHER PUBLICATIONS

Foo TKF, Saranathan M, Prince MR, Chenevert TL. Automated detection of bolus arrival and initiation of data acquisition in fast, three dimensional, gadolinium–enhanced MR angiography. *Radiology* 1997; 203: 275–280.

(List continued on next page.)

*Primary Examiner*—Ruth S. Smith
(74) *Attorney, Agent, or Firm*—Timothy J. Ziolkowski, Esq.; Carl B. Horton, Esq.; Michael A. Della Penna, Esq.

(57) ABSTRACT

A system and method for optimally imaging the peripheral vasculature is disclosed which includes defining a given number of scan stations along a patient's peripheral vasculature and initially injecting a relatively small amount of contrast agent into the patient to pass a test bolus through the patient's peripheral vasculature, and thereafter tracking the test bolus through the patient and adjusting the patient on a moveable table within the MR imaging device from one scan station to a next station to determine a maximum travel time that the test bolus takes to travel through each of the given number of scan stations. Additional contrast agent is then injected into the patient to pass an exam bolus through the patient's peripheral vasculature, and using the test bolus travel time, MR data can be acquired from each scan station while it is known that the exam bolus is present in that station to optimize image resolution. Initially, central k-space data is acquired for each scan station, and if time permits, the higher spatial frequency k-space data can be acquired. Otherwise, once the central k-space data is acquired for each station, the patient table is adjusted to the scan stations that require additional data acquisition. Similarly, if there is time remaining after all MR data is acquired for a particular scan station, the patient table can be moved to a previous scan station to acquire additional data in that station before moving to a subsequent scan station to acquire the central k-space data when the exam bolus arrives in that particular scan station.

29 Claims, 5 Drawing Sheets

U.S. PATENT DOCUMENTS 5,924,987 A * 7/1999 Meaney et al. ............. 600/420
5,928,148 A * 7/1999 Wang et al. ................ 600/420
6,167,293 A * 12/2000 Chenevert et al. .......... 600/420

OTHER PUBLICATIONS

Prince MR, Chenevert TL, Foo TKF, Londy FJ, Ward JS, Maki JH. Contrast enhanced abdominal MR angiography: Optimization of imaging delay time by automating the detection of contrast material arrival in the aorta. *Radiology* 1997; 203: 109–114.

Meany, Dr. James FM, Leeds General Infirmary, Leeds, UK Moving Bed MRA, The Future of Peripheral Arteriography? *Phillips*.

Kouwenhoven, M., MRA With Moving Bed Imaging, IX International Workshop on Magnetic Resonance Angiography and Introductory Course "New Horizons on MRA and CTA", Valencia, Oct. 7–11, 1997, Book of Abstracts, *The MR Angio Club*, p. 158.

* cited by examiner

METHOD AND APPARATUS FOR OPTIMAL IMAGING OF THE PERIPHERAL VASCULATURE

BACKGROUND OF THE INVENTION

The present invention relates generally to magnetic resonance (MR) angiography, which is the MR imaging of an artery or like vessel carrying blood and other fluid. More particularly, the invention pertains to a method of acquiring MR data at each of a number of scan locations or stations, which are spaced along the peripheral vasculature of a patient. Data is acquired after an initial test bolus of contrast agent is injected into the patient and is timed as it travels along the vessel or other conduit, from station-to-station. After the bolus travel time is known, an exam bolus is injected and MR data is acquired at each scan station while the bolus is located there.

It is a well known practice in MR angiography to insert a volume of contrast agent, such as gadolinium chelate, into blood flowing along a vessel. The volume or mass of contrast agent is referred to as a bolus, and has the effect of shortening the $T_1$ time of the blood. Thus, an MR image of the blood, acquired by a fast gradient echo or similar technique, will show up very well with respect to adjacent stationary tissue of the vessel structure. It is also well known, when imaging a blood vessel of comparatively great length, to acquire MR data from a patient at a given number of stations or scan locations, which are located at intervals along the vessel. To acquire MR data at a particular station, the patient is selectively positioned with respect to an MR scanner, typically by moving a patient table. Data is then acquired from a series of slices taken through a region or section of the patient in the particular scan location or station. Thereafter, the patient is shifted, relative to the scanner, so that data may be acquired from another section of the patient, in another scan station. MR angiography employing this procedure in conjunction with an injection of a contrast bolus may be referred to as bolus chasing peripheral MR angiography.

At present, when a contrast agent is used in connection with a peripheral MR angiography exam, the first scan station is selected to be the section of the patient, along a vessel of interest, at which the bolus arrives first. When the scan at the first station is completed, the acquisition normally moves to the next scan station. However, the most appropriate time to move to the next station is not precisely known. For example, in the case of slow blood flow, the distal vasculature at the next scan station may not have had adequate time to fill with contrast material. On the other hand, if flow rate is greater than anticipated, the contrast agent may tend to move into stationary tissue adjacent to the next scan station, before data acquisition commences. In either case, contrast between moving fluid and stationary vessel tissue may be significantly reduced at the next scan station. Moreover, undesirable effects, resulting either from flow rate which is too slow or too great, may tend to become progressively worse as imaging proceeds to subsequent scan stations and as the total number of scan stations increases.

Further, since the maximum safe dose of the contrast material cannot be exceeded, the number of scan sections or stations that can be imaged is limited and if an image is acquired either too early or too late, with respect to the flow of the contrast image, the repeatability of the exam is limited by that maximum safe dosage. Also, the coil must either be repositioned or switched manually such that the active elements are in the region of the imaged scan station. Consequently, the time required to complete a conventional peripheral MRA study is of the order of 1.5 to 2.5 hours.

It would therefore be desirable to have a method and apparatus that is capable of optimally imaging the peripheral vasculature that includes computer control over table motion and coil selection and obtain images at locations where it is known that the contrast bolus is present.

SUMMARY OF THE INVENTION

The present invention provides a method and apparatus for optimal imaging of the peripheral vasculature that includes computer control over patient table motion and coil selection such that the signal-to-noise ratio (S/N) can be optimized at each of a number of scan locations that solves the aforementioned problems. The coordination with table motion allows accurate reproducibility of the different scan locations, thereby permitting optimal subtraction of a pre-contrast image mask from images obtained after the contrast bolus has been introduced. The method described is designed to pursue the passage of a bolus injection from the aorta down to the arteries in the lower extremities to acquire images of the arterial phase. Subsequent image acquisitions and mask subtractions can also allow post-processing of the data to generate venous phase images.

In accordance with one aspect of the invention, a method of MR imaging peripheral vasculature of a patient includes defining a given number of scan stations, with each of the scan stations positioned along the patient's peripheral vasculature, and initially injecting a relatively small amount of contrast agent into the patient to initiate the passage of a test bolus through the patient's peripheral vasculature. The passage of the test bolus is then tracked through the patient's vasculature from one scan station to the next and the patient is moved fore and aft in the MR imaging apparatus to position the patient such that a desired scan station is within a field-of-view (FOV) of the MR imaging device based on the passage of the test bolus. The method also includes determining a travel time that it takes the test bolus to travel through each of the given number of scan stations, and thereafter, injecting additional contrast agent to form and pass an exam bolus through the patient's peripheral vasculature. By using the test bolus travel time for each scan station, the passage of the exam bolus can be pursued through the patient's peripheral vasculature and data can be acquired in each scan station during a period of time while the exam bolus is present.

In a preferred embodiment of the invention, the test bolus travel time to each station is initially determined. During the regular image acquisition phase of the MR exam, a predefined central k-space data block is acquired at each station in a time determined by the test bolus travel time to each station. If the test bolus travel time exceeds that for complete data at each station, the additional time is utilized by either acquiring additional higher k-space spatial frequency encoded data to improve spatial resolution, or to re-acquire the central k-space low spatial frequency data in order to improve image signal-to-noise ratio (SNR). Missing k-space data in each station, if any, would then be acquired at the end of the scan.

In accordance with another aspect of the invention, an MR system is disclosed that is capable of optimizing imaging of the patient peripheral vasculature and includes an MRI apparatus having a number of gradient coils positioned about a bore of a magnet to impress a polarizing magnetic field and an RF transceiver system, and an RF modulator controlled by a pulse control module to transmit RF signals to an RF coil assembly to thus acquire MR images. The MRI system of the present invention also includes a computer programmed to ensure placement of a movable patient table within the MRI apparatus and in a first scan station of a pre-defined given number of scan stations, and upon an indication that a test bolus has entered a given scan station of a patient, the computer is programmed to track the test bolus through that given scan station and record a travel time of the test bolus through that given scan station, then initiate patient table movement to a subsequent scan station. These steps are repeated for each subsequent scan station, and once complete, the computer returns the patient table to the first scan station. Upon an indication that an exam bolus has entered the patient, the computer activates the MRI apparatus to acquire at least central k-space MRI data of the patient within each of the scan stations for a period of time substantially equal to the test bolus travel time for that particular scan station, as previously recorded using the test bolus.

Accordingly, the method and apparatus of the present invention is used to control table position and move the patient from one scan station to another, and control coil element selection and set receiver and body coil transmitter gain parameters to optimize image S/N for each scan station. Additionally, the computer can adjust the acquisition matrix size or image field-of-view (FOV) at each station to optimize the image resolution on a per station basis.

Another feature of the preferred embodiment, is that once the bolus is introduced into the patient, the scan can be triggered using automatic bolus detection and triggering to assist in setting up the scan for the first scan station. After data acquisition of the first scan station, the computer can initiate movement of the patient table to the next station and select the appropriate receivers and adjust the transmitter and receiver gain settings appropriate for that particular scan station. This procedure is then repeated for each of the pre-programmed scan stations. In addition, by using a test bolus to determine the maximum imaging time available at each station, the MR data acquired is optimized to effectively visualize the arterial phase. The time available is used to acquire as many k-space lines as possible in each station before having to move to a subsequent station, with the central (low spatial frequency) k-space encoding lines acquired initially. It is noted that once sufficient k-space lines are acquired, or data acquisition at a particular station is complete, the system is capable of returning to a previous station to acquire additional k-space lines if time allows, or moving to a next station to acquire MR data, using the necessary table motion parameters and activation of the appropriate RF coil elements.

It is further noted that in peripheral run-off MRA, it is desired to image the peripheral arterial vasculature from the aorta at or above the level of the renal arteries, down to the lower extremities, including the feet. The present invention, as herein described, can also be used for a comprehensive assessment of the aorta, including the thoracic aorta, the abdominal aorta, and the aortoilliac segment. Where conventional MR imaging systems typically provide a maximum of 40–48 cm. image FOV, the present invention provides an effective imaging region of approximately 100–150 cm. FOV.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
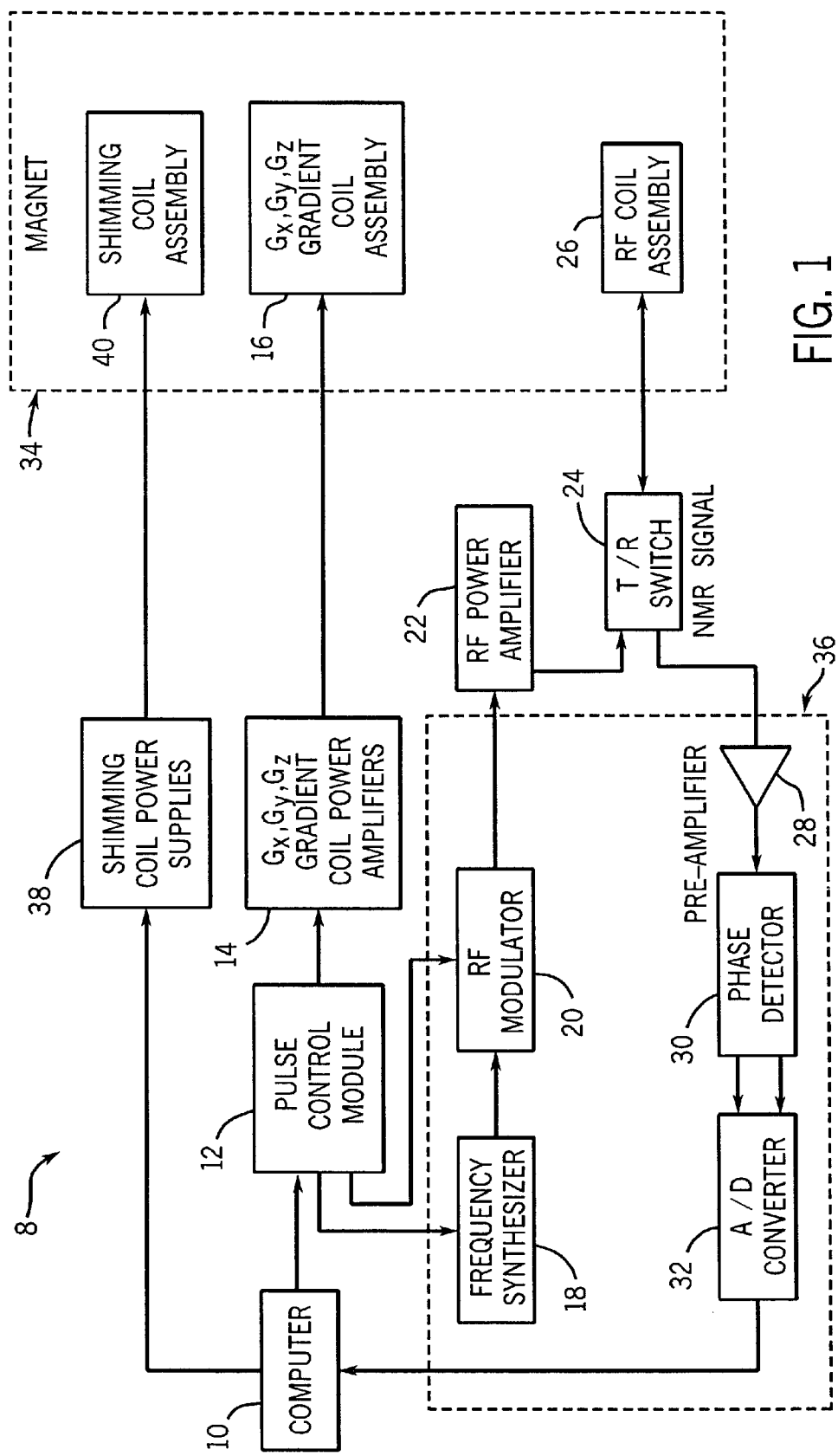
FIG. 1 is a schematic diagram showing basic components of an MR system for use in practicing embodiments of the invention.

Referring to FIG. 1, a magnetic resonance (MR) imaging system 8 of a type suitable for the practice of the invention includes a computer 10 which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16 which are positioned around the bore of the magnet 34 so that gradients Gx, Gy, and Gz are impressed along their respective axes on the polarizing magnetic field Bo from magnet 34.

The pulse control module 12 also controls a radio frequency synthesizer 18 which is part of an RF transceiver system, portions of which are enclosed by dashed line block 36. The pulse control module 12 also controls an RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The MR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce MR images of the object. Computer 10 also controls shimming coil power supplies 38 to power shimming coil assembly 40.

The present invention includes a method and system for MRI angiography for use with the above-referenced MRI system, or any similar or equivalent system for obtaining MR images.

Figure 2:
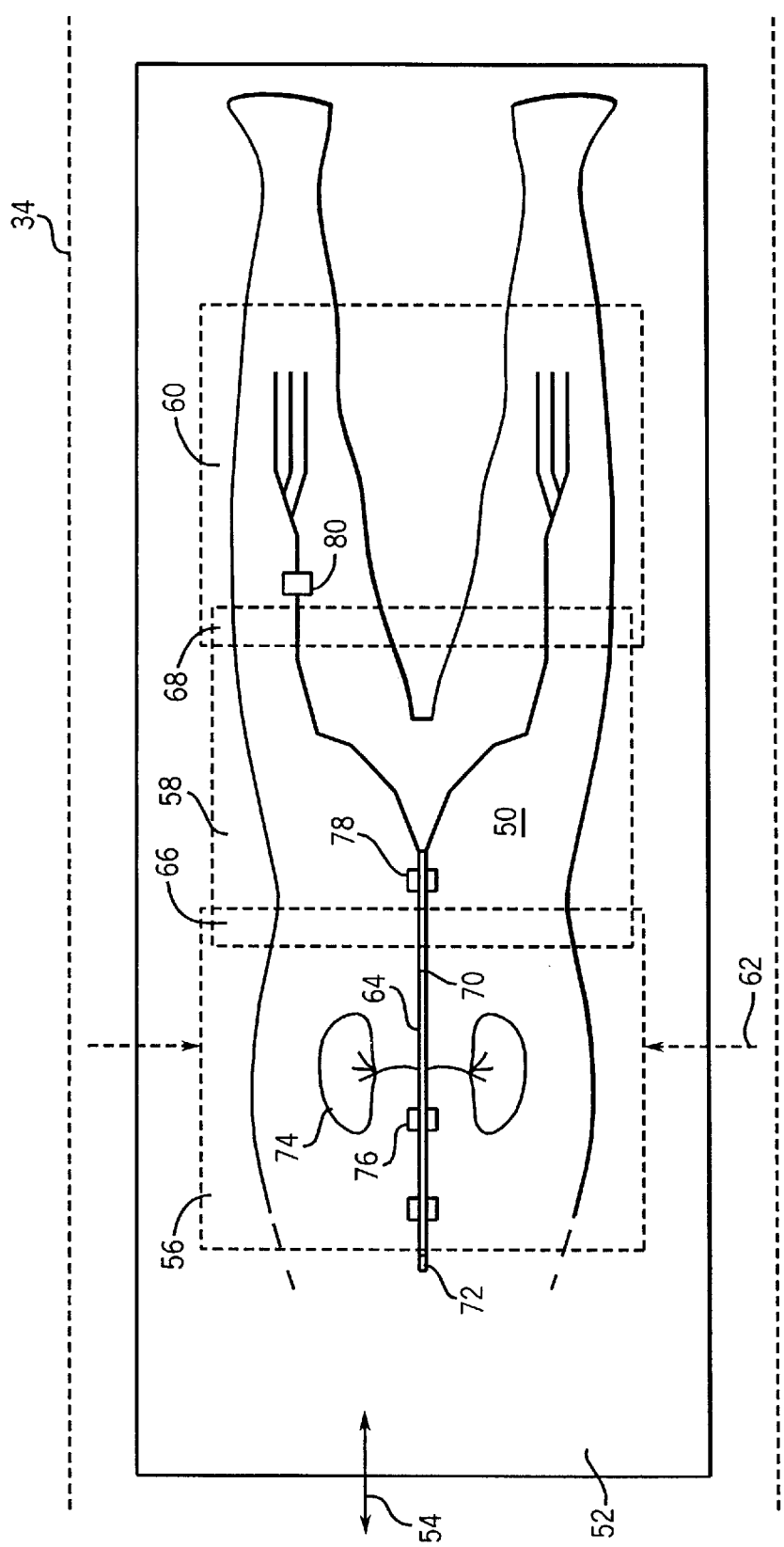
FIG. 2 is a schematic diagram illustrating an arrangement for conducting a peripheral MR angiography exam, in accordance with the invention.

Referring to FIG. 2, a patient 50 is shown supported on a computer controlled, movable table 52, which may be slid or translated fore and aft as indicated by arrow 54 in the magnet 34 of MR apparatus 8. Thus, patient 50 may be selectively positioned within the bore of main magnet 34. The motion of the table is under computer control whose position along axis 54 of the magnet bore can be precisely controlled and is reproducible.

More specifically, FIG. 2 shows patient 50 having a blood vessel 64 of substantial length, such as the aorta, femoral arteries, or other artery, extending from the abdominal area into the lower limbs of the subject. It is desirable to acquire MR image data of vessel 64 in its entirety. However, because of the substantial length of vessel 64, it is necessary to obtain the data by establishing a plurality of scan locations or stations 56, 58, 60 along the length of patient 50 and within components of the MR system. Each scan station 56, 58 includes a pre-defined section of patient 50. For example, scan station 56 includes the upper trunk area of patient 50, scan station 58 includes the lower trunk area, and scan station 60 includes the lower extremities of patient 50. To acquire MR data associated with a particular scan station, movable table 52 is moved fore and aft along axis 54 to position the particular scan station in a specified relationship with the main magnet 34. For example, FIG. 2 shows the midpoint of scan station 56 positioned at isocenter 62 of magnet 34.

In a conventional arrangement, an entire set of MR data pertaining to the segment of vessel 64, lying within scan station 56, would be acquired while such scan station was in the position shown in FIG. 2. Then, table 52 would translate patient 50 leftward, as viewed in FIG. 2, to position the midpoint of scan station 58 at isocenter 62. After scanning an entire set of data pertaining to the segment of vessel 64 within scan station 58, patient 50 would be further translated, to position the midpoint of scan station 60 at isocenter 62. A set of MR data pertaining to scan station 60 would then be scanned to complete the data acquisition procedure. It is noted that a certain amount of over-lap 66, 68 may occur between adjacent scan stations. This is both desired and needed to enable the effective combination of images from each station into a single combined image covering the entire extent of the imaged region from all stations.

It is common practice in MR angiography to intravenously inject a contrast agent, such as 20–40cc of gadolinium chelate, into blood 70 flowing through vessel 64 which provides a bolus 72 to flow through the blood stream 70. Since vessel 64 carries blood from the upper body to the lower limbs of patient 50, the flow direction is from left to right, as viewed in FIG. 2. After reaching the pulmonary system 74, the bolus 72 would arrive first at scan station 56, then arrive at scan station 58, and finally arrive at scan station 60.

In accordance with a conventional technique by the General Electric Company known commercially as SMARTPREP™ and as described in detail in Automated Detection of Bolus Arrival and Initiation of Data Acquisition in Fast, Three Dimensional, Gadolinium-Enhanced MR Angiography, by Foo T. K. L.; Saranathan M; Prince MR; Chenevert T L, in *Radiology* 1997; 203:273–280, a monitor 76 is placed in close proximity to vessel 64 and upstream of the arterial blood flow for the field-of-view that constitutes scan station 56, an example of which is shown in FIG. 2. The precise positioning of monitor 76 is not critical, but preferably, it is positioned within the first 25% of the relevant scan station. The monitor 76 periodically detects MR signal excited in a small volume or region of vessel 64. The detected MR signal will reach a specified threshold level when the contrast agent enters that portion or segment of vessel 64 lying within scan station 56, at which time scanning of station 56 commences. When the scan is complete, the MR apparatus will sequentially proceed to acquire data from the subsequent scan stations 58 and 60.

As previously indicated, in prior art MRA techniques, the time required for the bolus 72 to travel from one scan station to the next has not been known, and since it varies from patient to patient, it would be advantageous to know such travel time. In the past, this could significantly diminish the benefits of using a contrast agent in conventional scan techniques or require the use of increased quantities or dosages of gadolinium chelate contrast material. Thus, in order to overcome such disadvantages in the prior art, and in accordance with one embodiment of the present invention, monitors 78 and 80 are directed toward vessel 64 in scan stations 58 and 60. Monitors 78 and 80 can then detect the arrival of bolus 72 within scan stations 58 and 60, respectively. The operation and construction of monitors 78 and 80 is similar to that of monitor 76.

According to the present invention, there are two main algorithms to complete an MR image acquisition according to the preferred embodiment. The first, as shown in FIG. 3, is a test bolus travel time determination algorithm 82, and the second, is the MR image acquisition 84, as shown in FIG. 4, using the test bolus travel timing determination of FIG. 3.

Figure 3:
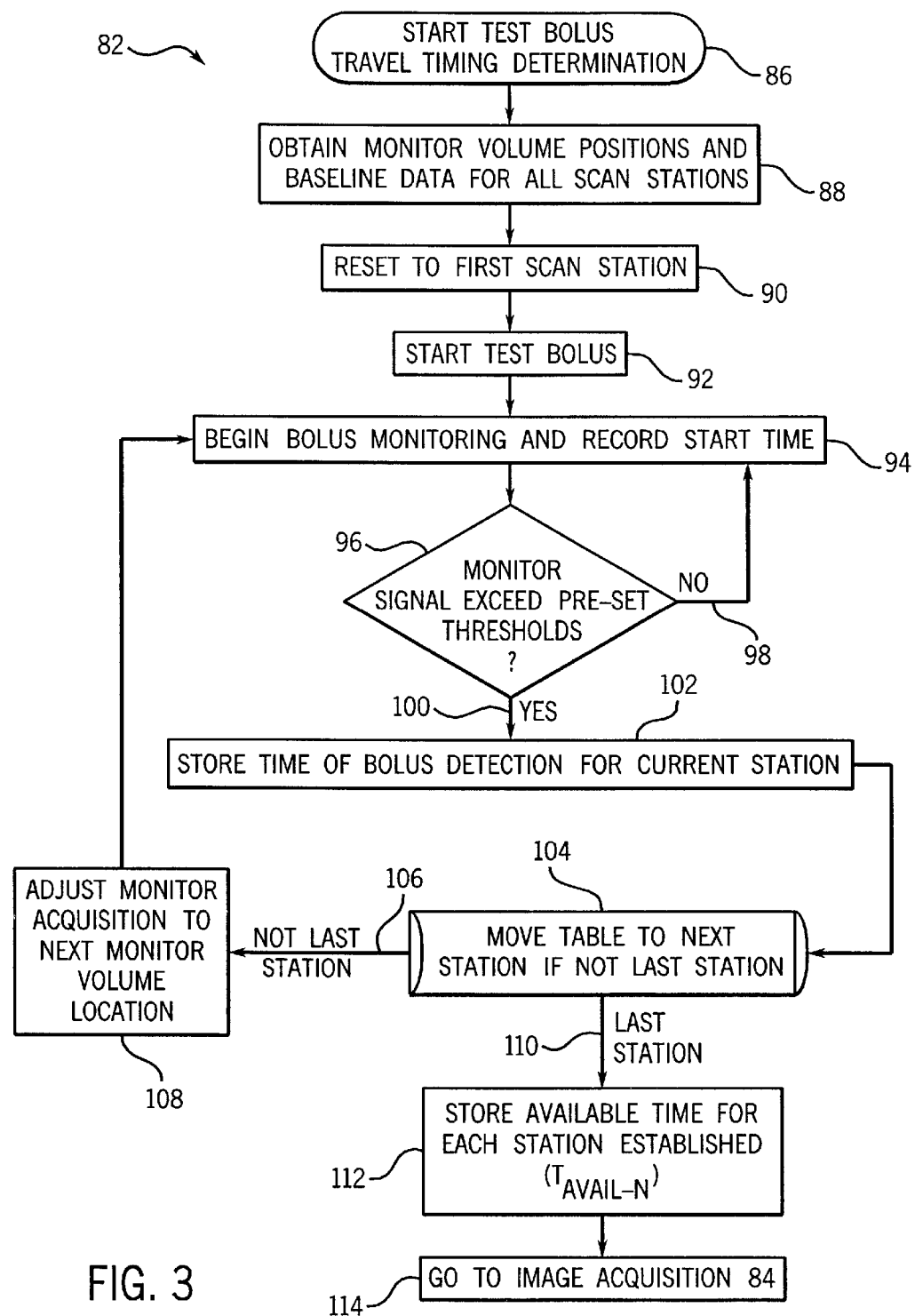
FIG. 3 is a flow chart illustrating an embodiment of the invention.

Referring to FIG. 3, the first step in the test bolus travel timing determination algorithm 82 after startup 86 is to obtain monitor volume positions and baseline data for all scan stations 88. Baseline data is obtained from each monitor prior to acquisition of image data of the angiography exam in the absence of contrast agent. From such data, a threshold level may be reset for each monitor to indicate arrival of the bolus at the corresponding scan stations. These localized scans are typically referred to as scout views. The system is then reset to the first scan station and the test bolus is started 92 by injecting a small amount of contrast agent, typically 1–5 ml, injected at the same flow rate as a regular exam bolus. The test bolus begins to pass through the patient's peripheral vasculature as the algorithm records the start time and begins bolus monitoring 94. It is noted that the monitor volume 76, 78, and 80 can be located anywhere within the image field-of-view within each station, and preferably, can be placed exactly over the area of interest within the desired field-of-view. At which time the MR signal monitored is compared against a preset threshold 96, and if the monitored signal does not exceed the preset threshold 98, the bolus monitoring continues at 94. When the monitored signal exceeds the preset threshold 100, the time at which the bolus is detected for that scan station is stored 102. The patient table is moved to a next, or subsequent, scan station as long as the current scan station is not the last predefined scan.

The monitor volume is then adjusted to acquire data at the next monitor volume location 108, at which time the system returns to begin bolus monitoring and recording the start time of that particular monitor volume at 94, and then continues to loop and acquire the travel time of the test bolus through each of the given number of scan stations until the last scan station is detected at 104, 110. The time available for acquiring imaging at a regular exam bolus, is then stored for each station as $T_{avail}$ at 112 and the system is then ready for regular MR image acquisition 114.

Figure 4:
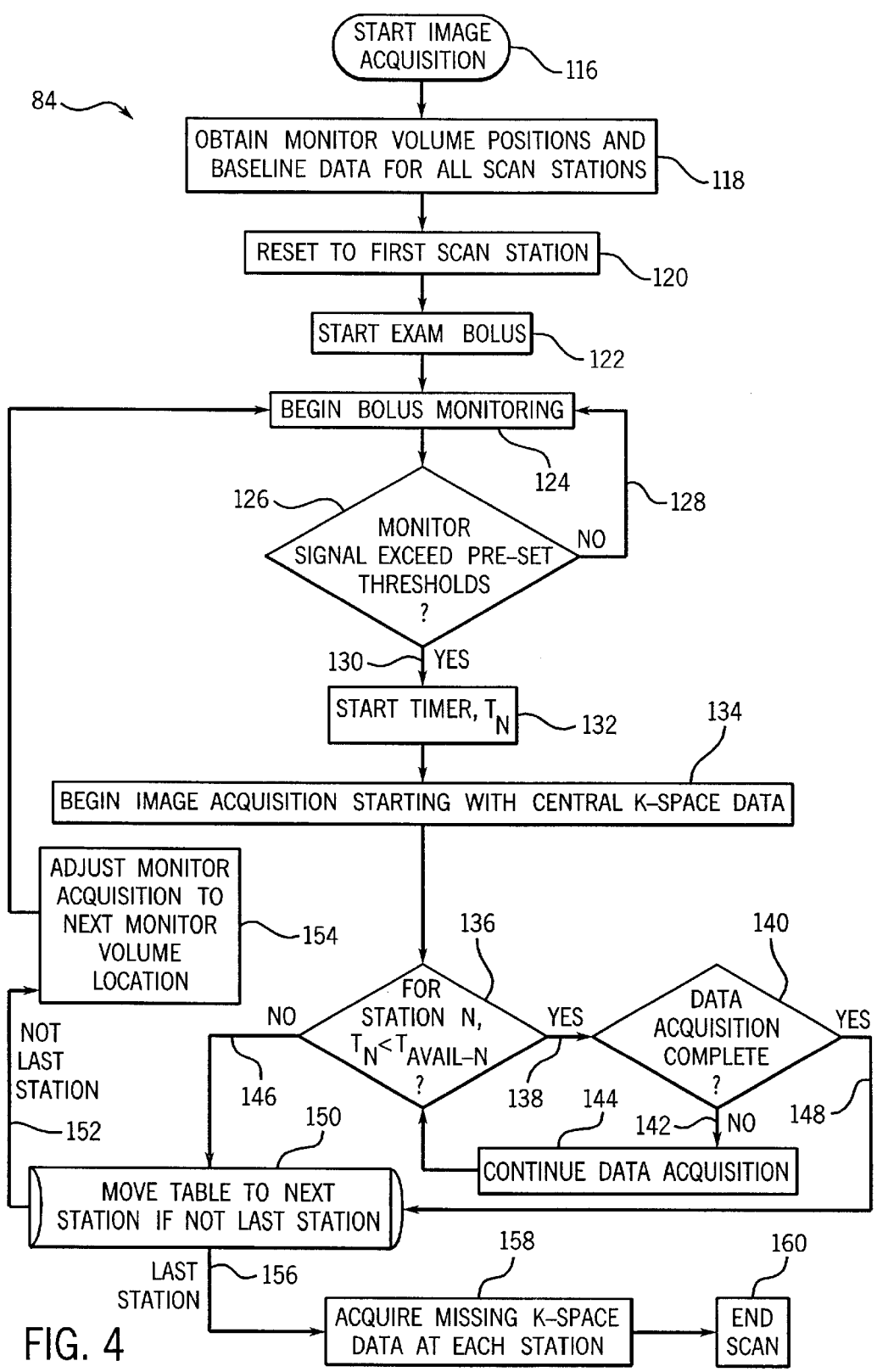
FIG. 4 is a flow chart illustrating an embodiment of the invention.

Referring to FIG. 4, the image acquisition algorithm 84 is shown, and after initialization 116, the monitor volume positions and baseline data for all scan stations are acquired 118. The system is then reset and the patient table is moved back to the first scan station 120 and the regular exam bolus is injected into the patient 122. Bolus monitoring is then commenced 124 while monitoring the monitor volume for the first scan station. The monitored signal is compared against the preset threshold 126, and if it does not exceed the preset threshold 128, the monitor rechecks for the presence of the bolus 124 until the monitored signal exceeds the preset threshold 130, at which time, the timer ($t_n$) is activated 132 and the MR apparatus begins image acquisition 134, starting primarily with the acquisition of central k-space data. The timer for that particular station is then compared to the test bolus travel time 136, and as long as the current data acquisition time is less than the test bolus travel time 138, and data acquisition is not yet complete 140, 142, the system continues to acquire data 144. Once either the data acquisition time for this particular scan station equals or exceeds the test bolus travel time 136, 146, or the system has acquired sufficient data 140, 148, the patient table is adjusted to the next scan station as long as the system is not currently at the last scan station 150, 152. After which, the system switches to acquire data at the next monitor volume location 154 and begins the bolus monitoring again at 124. The system then loops, as described, until data is acquired or the system times out for the last scan station 156. The system then returns to any scan station in which a full k-space data set had not been acquired, and acquires the missing k-space data 158. Once all k-space data is acquired for all the scan stations, the image acquisition algorithm is concluded 160.

While FIG. 2 shows three scan stations 56, 58 and 60, it is readily apparent that in other embodiments, the number of scan stations n may be greater or less than that shown in the preferred embodiment. Moreover, as is readily apparent from FIG. 4, the initial data acquisition at each scan station is described as being limited to acquiring central k-space data, that is, the k-space data of low spatial frequencies. This acquisition can be expanded to acquire higher spatial frequency k-space data if time permits. However, it is recognized that the lower spatial frequency k-space data is the most significant in image reconstruction, and can be usefully acquired in approximately 5–10 seconds.

Figure 5:
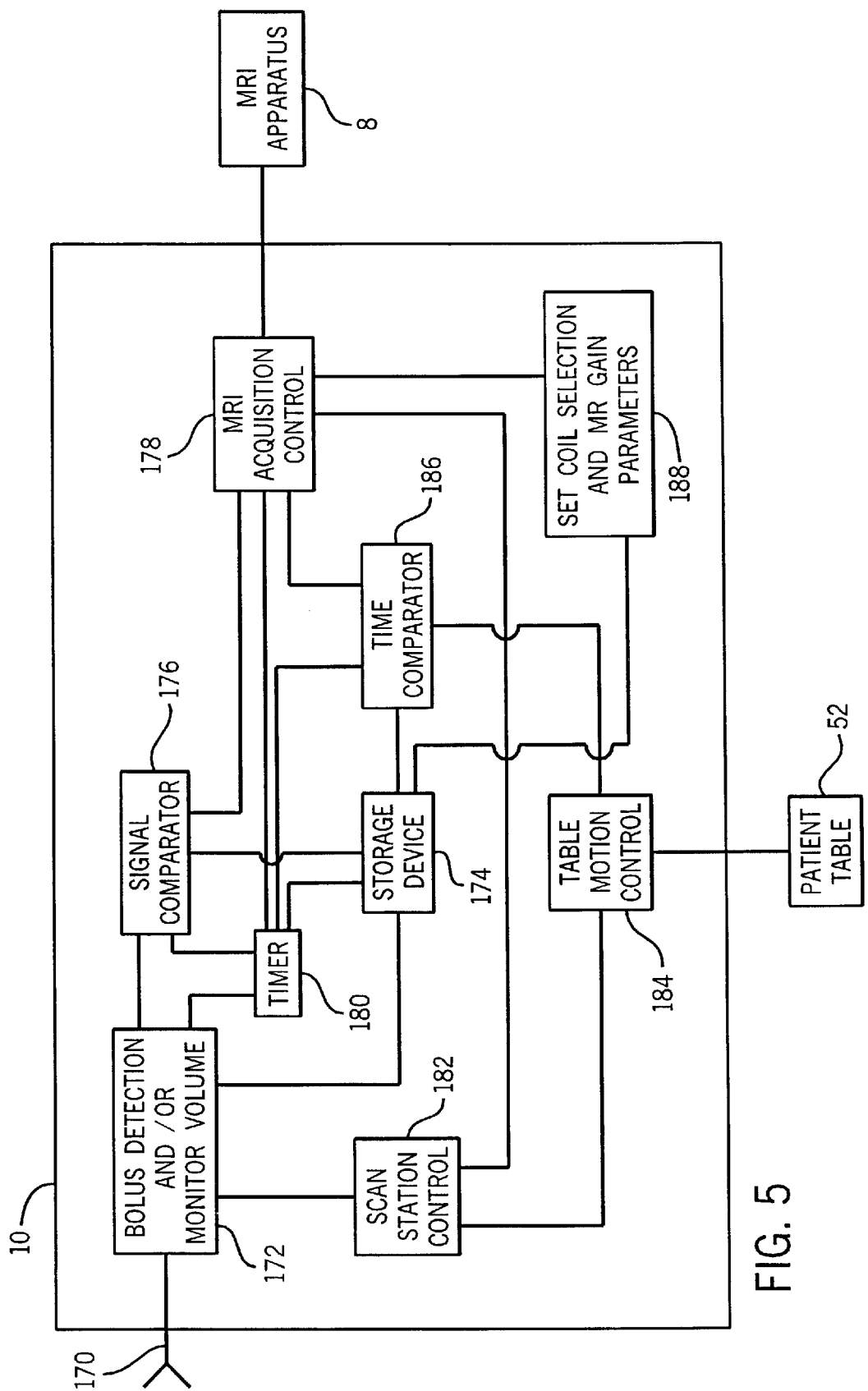
FIG. 5 is a block diagram of an embodiment of the invention.

FIG. 5 shows a functional block diagram of computer 10 connected to MRI apparatus 8, as shown in FIG. 1, and to the movable patient table 52. The control has an input 170 that may be used for indicating the start of a test bolus and/or the exam bolus to the bolus detection 172. Additionally, or alternatively, bolus detection can be accomplished by the aforementioned monitor volume procedure, one example of which is the aforementioned commercially available SMARTPREP™ from the General Electric Company. The storage device 174 is connected to the bolus detection 172 and receives preset thresholds for comparing the monitored signal from the monitor volume. The preset thresholds are compared to the monitored signals in a signal comparator 176, the output of which is used in an MRI acquisition control 178, together with the output of a timer 180, to check the location of the bolus using MRI apparatus 8. The MRI acquisition control 178 also is connected to a scan station control 182 which controls patient table 52 through table motion control 184. The scan station control 182 is also connected to the bolus detection 172 in order to reset the patient table to the first scan station when a procedure is first initialized. Timer 180 is also connected to storage device 174 to store the maximum travel time that it takes the test bolus to travel through a given scan station. Timer 180 is also connected between a signal compared to 176 and the MRI acquisition control 178 and is used during image acquisition to time the current MRI acquisition and compare it in time comparator 186 with the maximum test bolus travel time as retrieved from the storage device 174. To optimize image acquisition, the stored values for the test bolus travel time, for each scan station, are used in the MRI acquisition control 178 to select the most desirable coil elements in MRI apparatus 8 and to set the optimal receiver and body coil transmitter gain parameters in MRI apparatus 8.

Accordingly, the invention includes an MR imaging system for imaging a patient's peripheral vasculature that includes a means for acquiring MR images 8 and a means for tracking a test bolus 172 through a series of scan stations located along the patients' vasculature. A means for selectively positioning a patient 184, 52, in a desired scan station, and within the means for acquiring MR images 8 is responsive to the means for tracking the test bolus 172. Additionally, a means for determining and storing a maximum travel time 174, 180, 186 of the test bolus through each scan station, is used together with a control means 174, for acquiring MR images during the maximum travel time for each scan station.

The MR imaging system of the invention also includes a means for retrieving the maximum travel time 174, 186 and the timer 180 is used to track MR image acquisition time. A comparator 186 is used to compare the MR image acquisition time to the maximum travel time. The control means 178 first acquires central k-space MR data within the maximum travel time, then, if the maximum travel time has not expired, the control means 178 acquires higher spatial frequency MR data for the remaining time. The system also includes a means for acquiring monitor volume data 172 within each scan station and initiating the tracking of the test bolus and the response thereto. The MR imaging system also includes a means for selecting only a desired number of coils 188 and setting coil transmitter gain parameters in the means for acquiring MR images 8, in response to the position of the patient and the desired scan station, together with the maximum travel time of the test bolus through that particular scan station, for prescanning and acquiring a monitored signal indicative of a bolus presence.

The present invention has been described in terms of the preferred embodiment, and it is recognized that equivalents, alternatives, and modifications, aside from those expressly stated, are possible and within the scope of the appending claims.

What is claimed is:

1. A method of MR imaging peripheral vasculature of a patient comprising the steps of:
   defining a given number of scan stations, each scan station positioned along a patient's peripheral vasculature;
   initially injecting a relatively small amount of contrast agent into a patient to pass a test bolus through the patient's peripheral vasculature;
   tracking the test bolus through the patient's peripheral vasculature;
   adjusting the patient with respect to an MR imaging device to position the patient such that a desired scan station is within a field of view of the MR imaging device based on the passage of the test bolus;
   determining a travel time that the test bolus takes to travel through each of the given number of scan stations;
   injecting additional contrast agent into the patient to pass an exam bolus through the patient's peripheral vasculature; and
   using the test bolus travel time to pursue the passage of the exam bolus through the patient's peripheral vasculature.

2. The method of claim 1 wherein the test bolus is injected at a flow rate substantially similar to that of the exam bolus.

3. The method of claim 1 wherein the step of determining a travel time of the test bolus is further defined as determining a maximum test bolus travel time of the test bolus through the peripheral vasculature for each scan station.

4. The method of claim 3 further comprising the step of acquiring MR data for a period of time substantially equal to the maximum test bolus travel time for a given scan station to optimize an MR image of the patient's peripheral vasculature.

5. The method of claim 4 further comprising the step of suspending MR data acquisition after acquiring MR data for the maximum test bolus travel time for the given scan station, and thereafter, automatically moving the patient to another scan station based on the travel time of the test bolus.

6. The method of claim 5 further comprising the step of repeating MR data acquisition for the maximum test bolus travel time for each scan station.

7. The method of claim 1 further comprising the step of selecting a limited number of RF coil elements that are needed to acquire MR data within a given scan station, based on the test bolus travel time.

8. The method of claim 1 wherein the step of using the test bolus travel time to pursue the exam bolus passage through the patient's peripheral vasculature, further comprises acquiring MR data at each scan station for a period of time substantially equal to the test bolus travel time for that scan station, and after such time-limited MR data acquisition in each scan station, returning the patient to each scan station and completing MR data acquisition, including acquiring higher spatial frequency k-space data.

9. The method of claim 1 further comprising the step of setting RF transmitter and receiver gain settings for selected RF coil elements for a given scan station based upon the test bolus travel time for that given scan station, thereby optimizing MR image S/N ratio at each scan station.

10. The method of claim 1 further comprising the step of adjusting an MR data acquisition matrix size at each scan station, thereby optimizing MR image resolution on a per scan station basis.

11. The method of claim 1 wherein the step of tracking the test bolus through the patient's peripheral vasculature is further defined as tracking the test bolus through each of the scan stations, and the step of determining a travel time further includes determining an actual travel time that the test bolus takes to travel through each of the scan stations, and the step of using the test bolus travel time to pursue the passage of the exam bolus further includes using the actual test bolus travel time to pursue the passage of the exam bolus.

12. An MRI system to optimize imaging of patient vasculature comprising:
 a magnetic resonance imaging (MRI) apparatus having a plurality of gradient coils positioned about a bore of a magnet to impress a polarizing magnetic field and an RF transceiver system and an RF modulator controlled by a pulse control module to transmit RF signals to an RF coil assembly to acquire MR images; and
 a computer programmed to:
  (a) ensure placement of a patient table within the MRI apparatus and within a first scan station of a given number of scan stations;
  (b) upon an indication that a test bolus has entered a given scan station, track the test bolus through the given scan station;
  (c) record a travel time of the test bolus through the first scan station;
  (d) initiate patient table movement to a subsequent scan station;
  (e) repeat (b), (c) and (d) for each subsequent scan station;
  (f) return the patient table to the first scan station; and
  (g) upon an indication that an exam bolus has been injected into the patient, activate the MRI apparatus to acquire at least central k-space MRI data of the patient within each scan station for each test bolus travel time as previously recorded for that scan station.

13. The MRI system of claim 12 wherein the computer receives the indication that a test bolus has entered a given scan station from an automated detection system.

14. The MRI system of claim 12 wherein the computer receives the indication that a test bolus has entered a given scan station from an external input.

15. The MRI system of claim 12 wherein the computer records a maximum travel time of the test bolus for each scan station, and after the exam bolus has been indicated, the computer acquires MRI data within each scan station for the maximum bolus travel time for that scan station and initiates movement of the patient table to a next scan station to acquire MRI data in each scan station and thereby generate a full arterial phase image.

16. The MRI system of claim 15 wherein the computer acquires MRI data initially in a central k-space region during the maximum travel time of the test bolus, then after at least the central k-space region MRI data is acquired for each scan station, the computer returns the patient table to each scan station to acquire full MRI data sets in each scan station.

17. The MRI system of claim 16 wherein the computer generates mask subtractions of the central k-space region data from the full MRI data sets for each scan station to generate venous phase images.

18. The MRI system of claim 12 wherein the computer measures and records an actual travel time of the test bolus through each of the scan stations and where the MRI apparatus is activated to acquire at least central k-space MRI data in each scan station for the actual travel time of the test bolus through a respective scan station.

19. An MR imaging system for imaging a patient's vasculature comprising:
 means for acquiring MR images;
 means for tracking a test bolus through a series of scan stations defined along a patient's vasculature;
 means for selectively positioning a patient in a desired scan station within the means for acquiring MR images and responsive to the means for tracking a test bolus;
 means for determining and storing a maximum travel time of the test bolus through each scan station; and
 control means for acquiring MR images during the maximum travel time for each scan station.

20. The MR imaging system of claim 19 further comprising a means for retrieving the maximum travel time and a timer to track MR image acquisition time and a comparator to compare the MR image acquisition time to the maximum travel time, and wherein the control means first acquires central k-space data within the maximum travel time, then, if the maximum travel time has not expired, acquires higher spatial frequency MR data.

21. The MR imaging system of claim 19 further comprising means for acquiring monitor volume data within each scan station and initiating the tracking of the test bolus in response thereto.

22. The MR imaging system of claim 19 further comprising means for selecting only a desired number of coils in the means for acquiring MR images and setting coil transmitter gain parameters in the means for acquiring MR images in response to the position of the patient and the desired scan station and the maximum travel time of the test bolus through that scan station.

23. The MR imaging system of claim 19 further comprising:
 means for prescanning and acquiring a monitored signal indicative of a bolus presence;
 means for storing predetermined threshold values; and means for comparing the predetermined threshold values to the acquired monitored signal and commencing MR data acquisition only after the acquired monitored signal exceeds the predetermined threshold value for a given scan station.

24. The MR imaging system of claim 19 further comprising means for interrupting the control means if MR data acquisition is completed within the maximum travel time.

25. The MRI system of claim 19 wherein the means for determining and storing a maximum travel time of the test bolus through each scan station further includes measuring the travel time in real time and further includes recording a start time of bolus monitoring for acquiring the travel time of the test bolus through each of the scan stations.

26. A method of MR imaging peripheral vasculature of a patient comprising the steps of:

passing a test bolus through the patient's peripheral vasculature;

tracking the test bolus through the patient's peripheral vasculature;

determining a travel time that the test bolus takes to travel through a desired portion of the patient's peripheral vasculature;

passing an exam bolus through the patient's peripheral vasculature at a flow rate; and using the test bolus travel time to track the passage of the exam bolus through the patient's peripheral vasculature.

27. The method of claim 26 wherein the step of tracking the test bolus further includes tracking the test bolus through a portion of the patient's peripheral vasculature that exceeds an FOV of an MR scanner, and displacing the patient for tracking the test bolus.

28. The method of claim 26 wherein the step of determining a travel time that the test bolus takes to travel is further defined as measuring a travel time that the test bolus takes to travel before each displacement of the patient.

29. The method of claim 28 wherein the step of using the test bolus travel time to track the passage of the exam bolus further includes using the measured test bolus travel time to track the passage of the exam bolus through the patient's peripheral vasculature, and further includes acquiring MR data for the measured test bolus travel time before a patient displacement.

\* \* \* \* \*

UNITED STATES PATENT AND TRADEMARK OFFICE
CERTIFICATE OF CORRECTION

PATENT NO.    : 6,425,864 B1
DATED         : July 30, 2002
INVENTOR(S)   : Foo et al.

It is certified that error appears in the above-identified patent and that said Letters Patent is hereby corrected as shown below:

<u>Title page,</u>
Item [73], delete "The United States of America as represented by the Department of Health and Human Services, Washington, DC" and substitute therefor -- Uniformed Services University of Health Sciences, Department of Defense, United States Government, Bethesda, MD --;

Signed and Sealed this

Fifteenth Day of October, 2002

*Attest:*

*Attesting Officer*

JAMES E. ROGAN
*Director of the United States Patent and Trademark Office*